United States Patent [19]

Eitan

[11] Patent Number: 5,557,229
[45] Date of Patent: Sep. 17, 1996

[54] APPARATUS AND METHOD FOR PRODUCING AN OUTPUT SIGNAL FROM A MEMORY ARRAY

[75] Inventor: Boaz Eitan, Ra'anana, Israel

[73] Assignee: Waferscale Integration, Inc., Fremont, Calif.

[21] Appl. No.: 242,929

[22] Filed: May 16, 1994

[51] Int. Cl.⁶ .................................................. H03K 19/00
[52] U.S. Cl. ........................ 327/374; 327/398; 327/112; 327/288; 326/56; 326/57
[58] Field of Search ........................ 327/379, 384, 327/389, 398, 339, 401, 437, 288, 108, 374, 112; 326/27, 26, 34, 86, 83, 20, 56, 57, 58

[56] References Cited

U.S. PATENT DOCUMENTS

| | | | |
|---|---|---|---|
| 4,649,296 | 3/1987 | Shoji | 326/34 |
| 4,882,507 | 11/1989 | Tatsumi et al. | 326/58 |
| 5,087,840 | 2/1992 | Davies et al. | 326/86 |
| 5,173,627 | 12/1992 | Lien | 326/57 |
| 5,293,082 | 3/1994 | Bathaee | 327/379 |
| 5,414,379 | 5/1995 | Kwon | 326/57 |

OTHER PUBLICATIONS

M. Ando, et al., "A 0.1-μA Standby Current, Ground-Bounce-Immune 1-Mbit CMOS SRAM", *IEEE Journal of Solid-State Circuits*, vol. 24, No. 6, Dec. 1989, pp. 1708–1710.

T. Wada, et al., "Simple Noise Model and Low Noise Data-Output Buffer for Ultrahigh-Speed Memories", *IEEE Journal of Solid-State Circuits*, vol. 25, No. 6., Dec. 1990, pp. 1586–1588.

*Primary Examiner*—Timothy P. Callahan
*Assistant Examiner*—Jung Ho Kim
*Attorney, Agent, or Firm*—Skjerven, Morrill, MacPherson, Franklin & Friel; Forrest E. Gunnison

[57] ABSTRACT

An output device and method of operating it are disclosed. The output device includes a output control unit and an output buffer unit. The output control unit produces a data release (INR) signal after producing an output release (OR) signal, for example, by delaying the OR signal. The INR signal causes release of an output signal from a sense amplifier, resulting in a data signal. The output buffer includes n- and p-channel switching transistors and control units controlling their gates. In response to activation of the OR signal, the control units bring the voltage of the gates of the switching transistors to respectively slightly above and slightly below the threshold levels of their gates. In response to the data signal, the control units fully activate one of the switching transistors and deactivate the other of the switching transistors depending on the voltage level of the data signal. The speed with which the control units respond to the data signal is controlled.

7 Claims, 7 Drawing Sheets

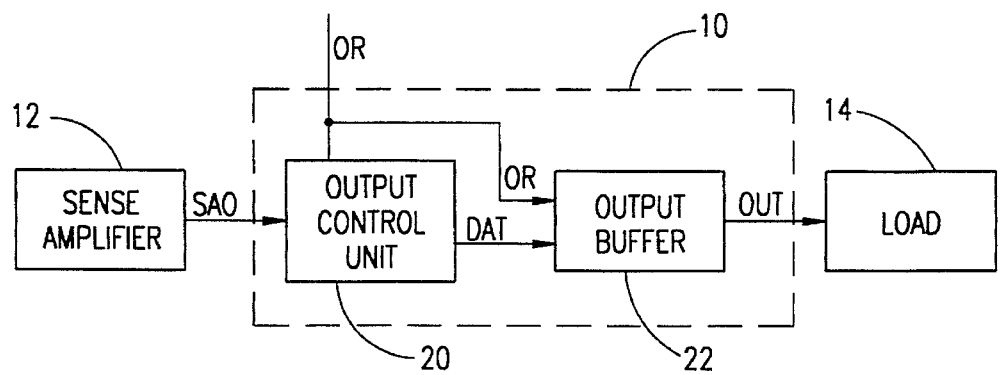
FIG.2
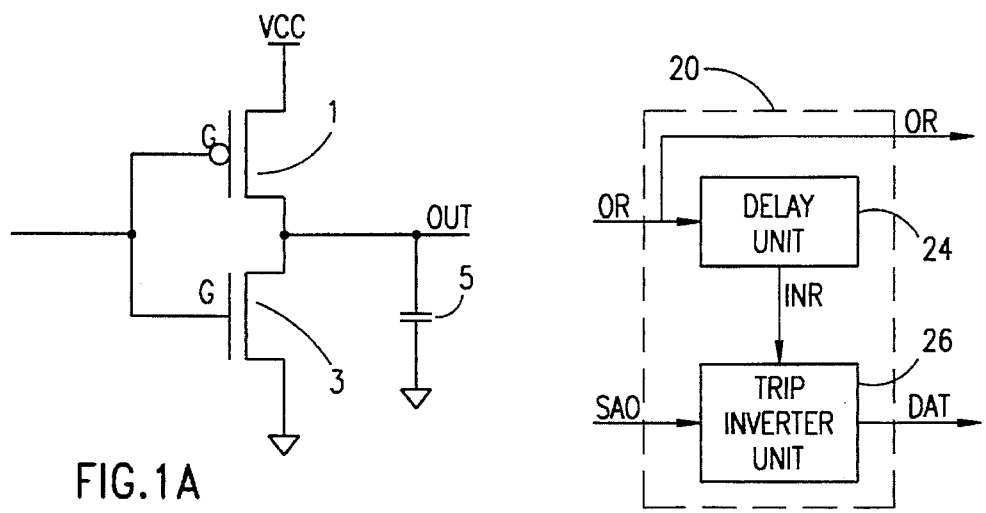
FIG.1A
FIG.3
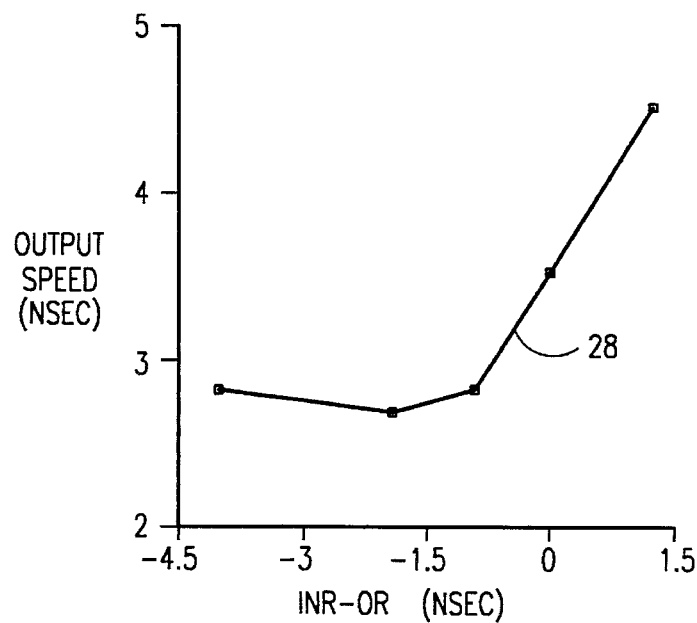
FIG.4

APPARATUS AND METHOD FOR PRODUCING AN OUTPUT SIGNAL FROM A MEMORY ARRAY

FIELD OF THE INVENTION

The present invention relates generally to output noise reduction for memory arrays.

BACKGROUND OF THE INVENTION

Memory arrays typically comprise a plurality of memory cells, each storing one bit of data. To read the data in a cell, addressing signals are provided to it and the resultant voltage level is provided to output devices which convert the voltage to one of two predetermined levels indicating either a "1" or a "0".

Reference is now briefly made to FIG. 1A which illustrates a basic output device. The output device includes a p-channel transistor 1, connected between an output line OUT and a Vcc internal supply, and an n-channel transistor 3 connected between the output line OUT and a Vss ground supply. The output line OUT typically has a load 5 on it, represented in FIG. 1A by a capacitor.

A control signal, representing the data read from the memory cell, is provided to the gates G of the two transistors. In response, one of the transistors is activated and the other is deactivated. If the p-channel transistor 1 is activated, it pulls the output line OUT towards the Vcc supply voltage. If the n-channel transistor 3 is activated, it pulls the output line OUT towards the Vss ground supply voltage.

Typically, the load 5 is formed of many processing devices, such as integrated circuit chips, which are connected to the output device via a bus and which access the memory array whenever they need the data stored therein. A bus, due to its large capacitance, is a large load. Since it is desired to read data from the memory arrays quickly, the output devices often have to switch values quickly which is achieved by supplying high currents to the output devices.

Unfortunately, the fast switching generates noise on the supply voltage Vss of the output device, where the noise V_N is generated due to the inductance L of the bus and of the processing devices (e.g. the "package") and is described by:

$$V\_N = L * di/dt \quad (1)$$

where i is the current and di/dt is the speed at which the current changes.

The noise is especially problematic if the output signal is provided as an input signal to a transistor logic (TTL) device. TTL devices have an industry standardized allowed input voltage range from 0.8 V to 2.0 V between which their input signal must remain. The TTL devices then compare this to the ground supply voltage Vss to determine whether they received a "1" or a "0" indication.

If the high end of the range, known as $V_{1H}$ and indicating a "1", is solidly at 2.0 V and the supply voltage Vss of the memory array should be at 0.0 V but, due to the noise $V_{13}N$ on the supply voltage Vss, is really at 1.5 V, the voltage difference upon which the TTL device acts is only 0.5 V which the TTL device will interpret as a "0" rather than as a "1".

To reduce the noise, one has to control di/dt. The inductance L of the package can also be reduced, but for a given type of package, the inductance L is a given.

Over the years, many solutions have been proposed to reduce and control di/dt. These solutions are based on the fact that the speed di/dt is limited by low Vcc voltage levels and high operating temperatures while the noise is limited by high Vcc voltage levels and low operating temperatures, where Vcc is the internal supply voltage. Each technique includes voltage and temperature compensation to minimize the variation between the ideal speed and noise operating conditions.

Alternatively, one can spread the noise as evenly as possible across the switching period by providing a constant di/dt. This is a very complex task.

One way to speed up the circuit for a given noise is to minimize the output swing either by not letting the output move to the full Vcc level or by forcing the output to an intermediate level during the read cycle while waiting for the correct data to arrive and then letting the output swing. The second option is illustrated in FIG. 1B to which reference is briefly now made.

FIG. 1B is a voltage-time graph illustrating two possible voltage curves for the gate of pull-down transistor 1 (FIG. 1A) when operating against a 100 pF load. One curve, labeled 2, has a constant voltage change (dV/dt) and the other curve, labeled 4, has an initial, steep rise 6 in voltage to a threshold level of the gate and a later, more gentle rise 8 to the final voltage level. Gentle rise 8 may be produced with a function such as $\sqrt{V_G - V_T}$. The noise signal corresponding to curves 2 and 4 are also shown and are labeled 7 and 9, respectively. The output signals corresponding to curves 2 and 4 are labeled 11 and 13, respectively.

Curve 4 utilizes the fact that, until the voltage on an n-channel transistor, such as pull-down transistor 1, reaches a threshold level, the transistor will not conduct current. Therefore, the current speed is negligible during the voltage rise to the threshold level and any rate of voltage rise will not affect the output noise.

Although the total amount of noise integrated over the period shown is the same, noise curve 9 is much more uniform and has a lower overall noise level than noise curve 7. Noise curve 9 is more desirable since the noise problem stems mostly from the maximum level of the noise rather than from its duration.

Output curve 13, corresponding to gate ramp 4, falls to the desired output value faster than does output curve 11. Therefore, gate ramp 4, which has the less noisy output, also has the faster speed.

The following articles describe the prior art:

"A 0.1-μA Standby Current, Ground-Bounce-Immune 1-Mbit CMOS SRAM", by M. Ando, et al., *GA Journal of Solid-State Circuits*, Vol. 24, No. 6, December 1989, pp. 1708–1710; and "Simple Noise Model and Low-Noise Data-Output Buffer for Ultrahigh-Speed Memories", by T. Whitey, et al., *IEEE Journal of Solid-Sta Circuits*, Vol. 25, No. 6, December 1990, pp. 1586–1588.

Any number of the prior art techniques can be utilized together to reduce the overall output noise and to improve the speed.

SUMMARY OF THE PRESENT INVENTION

It is an object of the present invention to provide a further solution to the problem of noise on the output signal, for a clocked memory design. The solution of the present invention increases the speed of the output for a given noise level.

An output device and method of operating it are disclosed. The output device includes a output control unit and an output buffer unit. In accordance with a preferred embodiment of the present invention, the output control unit produces an output release signal (OR) before data from a sense amplifier is ready. After a predetermined delay, an INR signal releases the data from the sense amplifier, resulting in the correct data signal propagating to the output buffer and being read by the output buffer with maximum speed and minimum noise.

As in the prior art, the output buffer includes an n-channel pull-down transistor and a p-channel pull-up transistor and control units controlling their gates. In accordance with a preferred embodiment of the present invention, when the OR signal is activated (which is before the INR signal release the data), the control units bring the voltage of the gates of the pull-up and pull-down transistors to slightly above the threshold levels of their gates, thereby preparing the output buffer to respond as soon the data signal arrives.

Immediately upon release of the data signal, the control units fully activate one and deactivate the other of the pull-up and pull-down transistors depending on the voltage level of the data signal. The speed with which the control units respond to the data signal is controlled to initially quickly increase the output signal, after which it is gradually slowed down. This action also serves to reduce the output supply voltage noise.

BRIEF DESCRIPTION OF THE DRAWINGS

The present invention will be understood and appreciated more fully from the following detailed description taken in conjunction with the drawings in which:

FIG. 1A is a schematic circuit diagram illustration of a prior art output buffer unit;

FIG. 2 is a block diagram illustration of output elements including an output device, constructed and operative in accordance with a preferred embodiment of the present invention;

FIG. 3 is a block diagram illustration detailing the output control unit forming part of the device of FIG. 2;

FIG. 4 is a graphical illustration showing the relationship of output speed to the delay between INR and OR signals;

DETAILED DESCRIPTION OF A PREFERRED EMBODIMENT

Figure 1B:
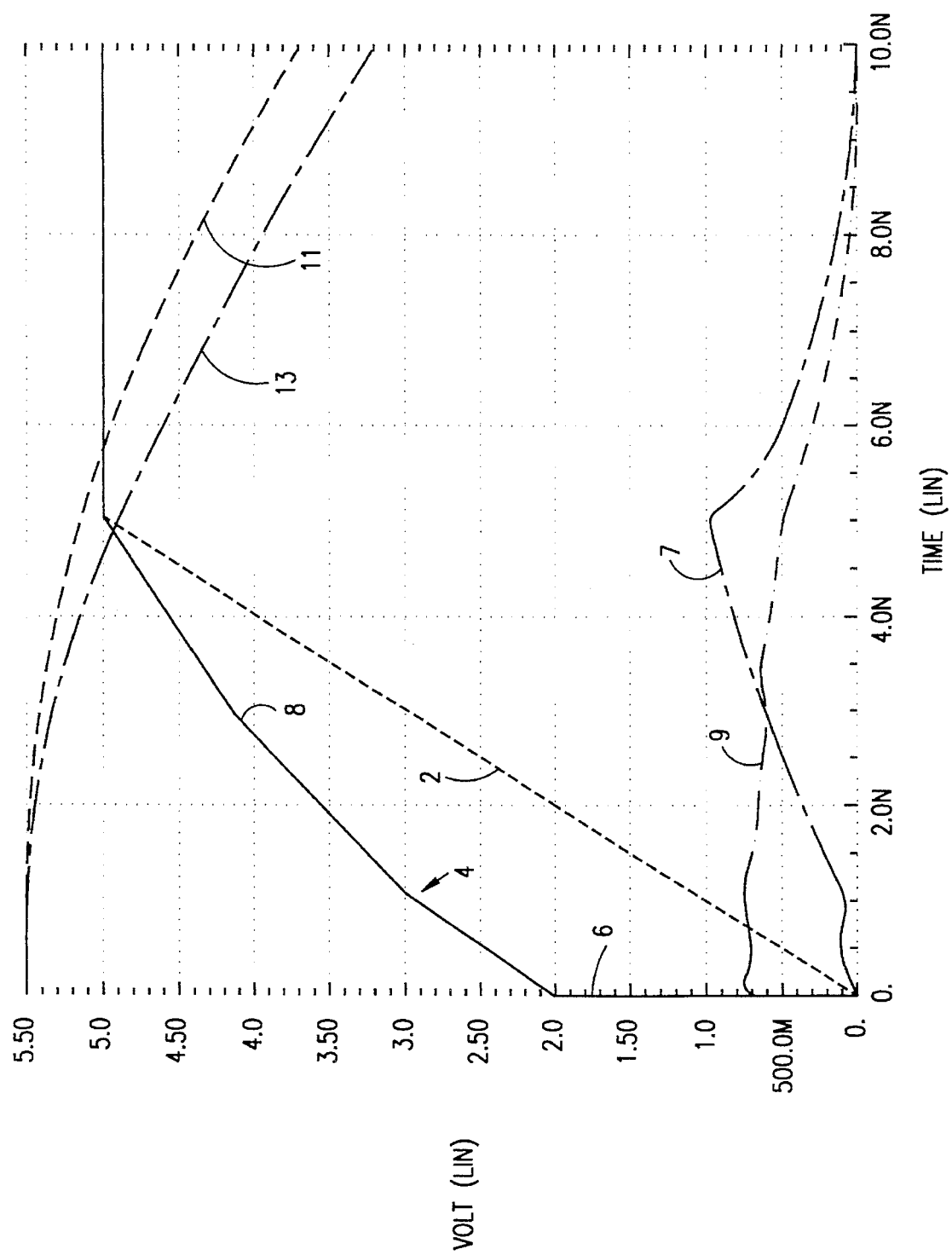
FIG. 1B is a voltage-time illustration graphing two possible rates of voltage change and their resultant noise and output signals.

Reference is now made to FIG. 2 which illustrates the elements in the present invention which are involved in providing an output signal, and to FIG. 3 which illustrates, in block diagram format, one embodiment of the output device of the present invention.

The output device 10 of the present invention receives a sense amplifier signal SAO from a sense amplifier 12 forming part of a memory array and converts the sense amplifier signal SAO to an output signal OUT which is provided to a load 14. The output device 10 comprises an output control unit 20 and an output buffer 22. The output control unit 20 converts the sense amplifier output SAO to a data signal DAT having a voltage range between the ground supply Vss and the internal supply Vcc and produces control signals to prepare the output buffer 22 to respond as soon as the data signal DAT arrives with valid voltage levels.

As shown in FIG. 3, the output control unit 20 comprises a delay unit 24 and a trip inverter unit 26. As in the prior art, once the sense amplifier 12 has developed a signal from the memory array, an input release signal INR is activated which, in turn, causes the trip inverter unit 26 to release the sense amplifier signal SAO and to amplify signal SAO to have the voltage range from Vss to Vcc.

In accordance with the present invention, the INR signal is activated in delayed response to an output release signal OR wherein, at the same time, the OR signal is utilized to prepare the output buffer 22 for the upcoming data signal DAT. This is in contrast to the prior art which produces the OR signal from the INR signal thereby preparing the output buffer 22 only once the data signal DAT has been produced. In the present invention, the INR signal comes, as in the prior art, once the sense amplifier 12 has developed the signal. However, in the present invention, the OR signal is clocked to arrive a few nanoseconds prior to the moment when the SAO signal is fully developed.

Reference is now briefly made to FIG. 4 which illustrates, for Vcc of 4.5 V and an operating temperature of 90°, the relationship between the output speed and the delay time between the INR and OR signals for reading a 0 (i.e. the output pulled down). The curve 28 of FIG. 4 is for a CMOS process with an output load of 30 pF and a maximum output current of 6 mA. Most of the discussion hereinbelow will center on the transition to Vss since this transition causes a positive bounce on the Vss supply. This noise typically causes most of the problems with the input; however, one skilled in the art will understand that the present invention is not limited to this transition.

The curve 28 indicates that, when, as in the prior art, the INR signal comes first (i.e. INR-OR is positive), the output speed is slow, over 3.5 ns. Typically, for a 4.5 nsec output speed, the delay from INR to OR signals is 1 nsec.

Curve 28 also indicates that, when the OR signal comes first (i.e. INR-OR is negative), the output speed is faster. As can be seen, the speed gain is maximized at a delay from the OR to the INR signal of 2 nsec after which there is a slight degradation in speed. This is due to the fact that, once the output is ready for the data, there is no more ready. The slight loss will be explained later, with the details of the output buffer circuitry.

Reference is now made back to FIGS. 2 and 3. As will be described in more detail hereinbelow, the output buffer 22 comprises two halves for responding to a "1" or a "0" respectively. In accordance with the present invention, the activation of the OR signal causes each half of the output buffer 22 to begin to move from an initial voltage level toward its full voltage level. Typically, the halves do not reach the full voltage level but approach about half of it. At the same time, though, the output signal OUT is not affected.

When the activated DAT signal arrives, the relevant half of the output buffer 22 moves to its full voltage level while the other half returns to its initial voltage level.

Since each half of the output buffer 22 moves toward its full voltage level while the sense amplifier 12 develops the SAO signal, as soon as the SAO signal, in its DAT signal form, arrives, the output signal OUT can begin to swing. If desired, the rise to the full voltage level can be slow, as in curve 4 of FIG. 1 and thus, the output noise level is kept low. Alternatively, the voltage level can rise quickly which produces a faster circuit but with a high noise level.

Figure 5:
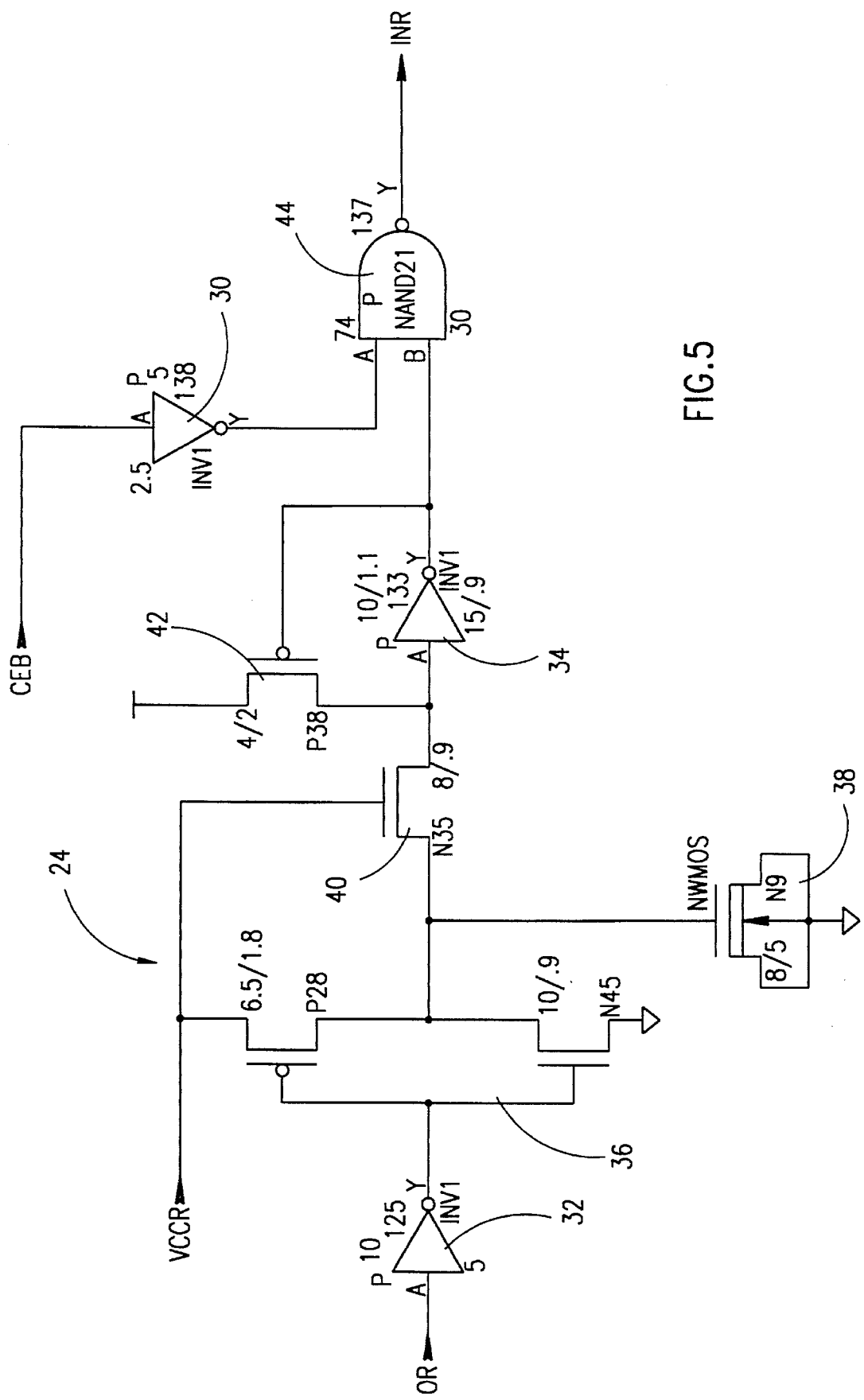
FIG. 5 is a circuit diagram illustration of a delay unit forming part of the device of FIG. 2.
Figure 6:
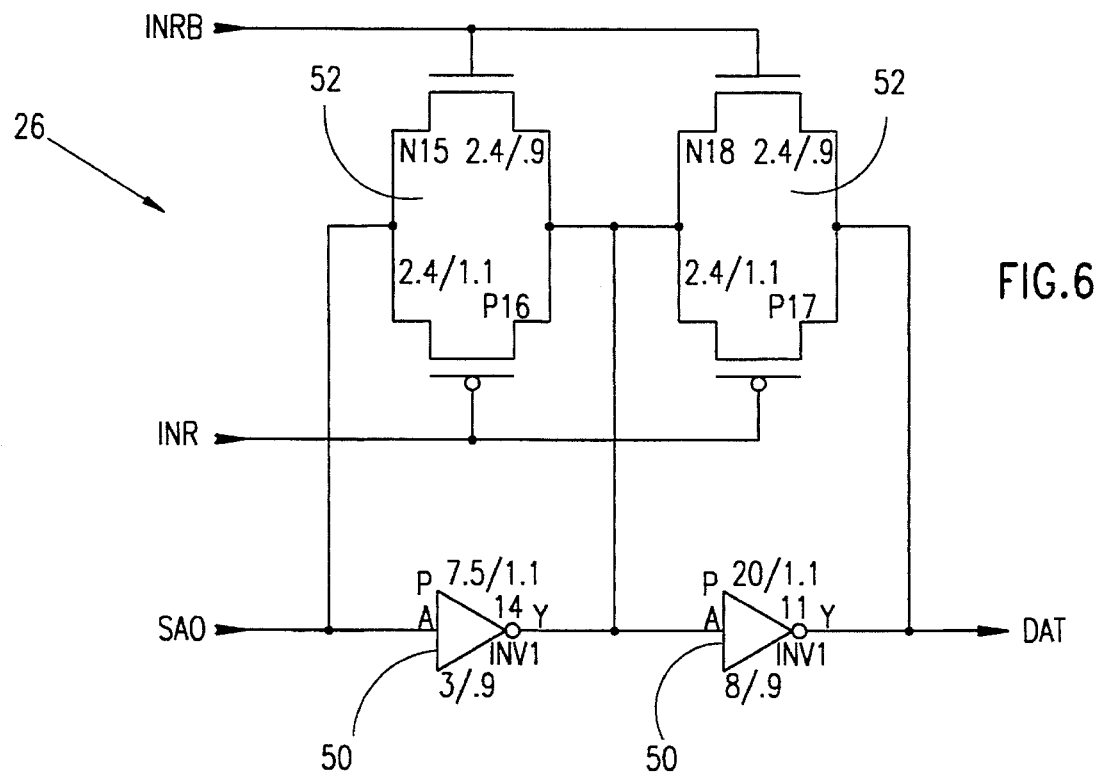
FIG. 6 is a circuit diagram illustration of a trip inverter unit forming part of the device of FIG. 2.
Figure 7:
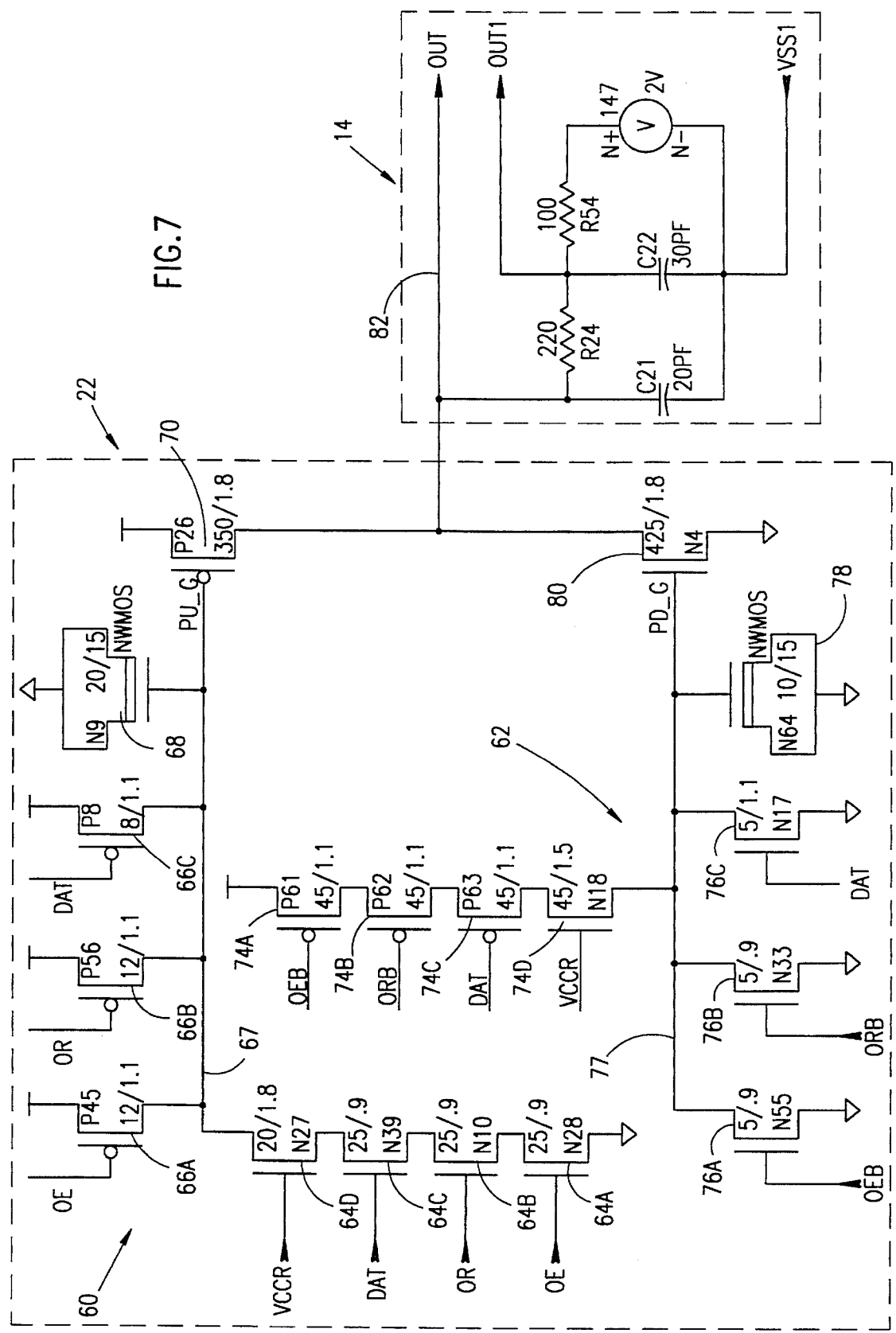
FIG. 7 is a circuit diagram illustration of an output buffer forming part of the output device of FIG. 2.

Circuit diagrams for exemplary embodiments of delay unit 24, trip inverter 26 and output buffer 22 are provided in FIGS. 5, 6 and 7, respectively, to which reference is now made.

The delay unit 24 typically comprises three Vcc inverters 30, 32 and 34, a Vccr inverter 36, a capacitor 38, a separating transistor 40, a pull-up transistor 42 and a nand gate 44.

Inverters 32 and 36 together delay the OR signal by one cycle. Unfortunately, the length of the cycle decreases as the voltage of the Vcc supply, to which inverter 32 is connected, increases. To maintain the length of the delay, inverter 36 is controlled by a regulated supply (Vccr), rather than by the Vcc supply. The Vccr supply provides a voltage level equivalent to the Vcc supply for Vcc less than a predetermined level, such as 4.6 V. For Vcc greater than the predetermined level, the regulated supply Vccr provides the predetermined voltage level. Thus, the delay provided by inverter 36 is relatively constant.

Capacitor 38 increases the delay without inverting the signal.

Separating transistor 40 transfers the delayed signal towards inverter 34. Separating transistor 40 separates the Vcc-controlled inverted signal to its right from the Vccr controlled signal to its left. Pull-up transistor 42 pulls the voltage level to the right of separating transistor 40 to Vcc so that the signal which enters inverter 34 will track Vcc.

Separating transistor 40 and pull-up transistor 42 serve to reconstruct the full Vcc level on the gate of inverter 34. This has no speed implications but prevents any leakage current in inverter 34 at the end of the cycle. It also prevents any forward biased junction on the transistors of Vccr inverter 36 when pull-up transistor 42 pulls the gate of inverter 34 all the way to the Vcc level.

The INR signal is produced only if the memory array is enabled by a chip enable (CE) signal. The nand gate 44 receives a delayed version of CEB (the inverse of the CE signal) through inverter 30. If the chip is enabled, nand gate 44 inverts and passes the signal, thereby producing the INR signal.

It will be appreciated that, if more delay is required, the capacitance of capacitor 38 can be increased.

The trip inverter unit 26 includes two cascaded inverters 50 (FIG. 6) and two pass devices 52. The first cascaded inverter 50 receives the SAO signal from sense amplifier 12. The two pass devices 52 are controlled by the INR signal and its inverse signal INRB.

When the INR signal is inactive or low (and the INRB signal is correspondingly high), the pass devices 52 short the inverters 50 together which forces the inverter output to go to a fixed voltage level, such as Vcc/2. The shorting of the pass devices 52 also forces the SAO signal to go to the fixed voltage level.

Since the OR signal has already been activated, the sense amplifier 12 has begun to develop the signal from the memory cell. However, due to the shorting of the pass devices 52, the sense amplifier 12 cannot output a signal.

Once the INR signal goes high, the pass devices 52 open up, freeing the sense amplifier 12 to move the SAO signal in the direction indicated by the data stored in the memory cell. The inverters 50 not only delay the SAO signal slightly, they also amplify it to the Vcc or to the Vss supply levels, depending on the value of the SAO signal. This creates the DAT signal.

It is noted that, since the inverters 50 have been held at Vcc/2, the DAT signal only has to move half of the range to reach its final value.

FIG. 7 illustrates the elements of the output buffer 22 and a sample load 14. The output buffer 22 comprises two branches 60 and 62. Branch 60 comprises a series of concatenated n-channel pull-down transistors 64, a series of p-channel pull-up transistors 66 connected in parallel to a line 67, a capacitor 68 and a p-channel output pull-up transistor 70. Branch 62 comprises a series of concatenated mostly p-channel pull-up transistors 74, a series of n-channel pull-down transistors 76 connected in parallel to a line 77, a capacitor 78 and an n-channel output pull-down transistor 80. Output transistors 70 and 80 are both connected to output line 82.

As will be described hereinbelow, the two branches 60 and 62 respond in opposite directions to control signals. When the DAT signal indicates a "1" value, the p-channel output pull-up transistor 70 of branch 60 pulls the output signal OUT up to Vcc. When the DAT signal indicates a "0" value, the n-channel output pull-down transistor 80 of branch 62 pulls the output signal OUT signal down to the ground supply Vss. Therefore, more emphasis will be placed hereinbelow on branch 62.

The output speed is typically measured at 1.5 V. This implies that one has to pull down the OUT from 4.5 V to 1.5 V to read a "0" and only from 0 to 1.5 V to read a "1". This, in return, requires that, to maintain the same speed, the pull-down has to be twice as fast and hence will have more noise.

Therefore, in the present invention, output signal OUT is tri-stated, meaning that it can have three voltage levels. The load 14 is designed to provide a non-read voltage of 2.0 V and read voltages of 1.5 V for a "0" and 2.5 V for a "1". Thus, both states of the data have the same 0.5 V transition. Despite this, the Vss noise generated in the 0 transition affects the input more, as was described hereinabove. Therefore, the operations of branch 62 are of greater concern.

Typically, the output enable (OE) signal is always active and therefore, for the present discussion, pull-down transistor 64a and pull-up transistor 74a can be assumed to be active and pull-up transistor 66a and pull-down transistor 76b can be assumed to be inactive.

When the OR signal is inactive, pull-up transistor 74b is off and pull-down transistor 76b is on. Therefore, none of pull-up transistors 74 affect the line 77 while pull-down transistor 76b keeps the voltage on line 77 at ground supply Vss, which, in turn, keeps n-channel output pull-down transistor 80 off.

At the same time, pull-down transistor 64b is off and pull-up transistor 66b is on. Therefore, none of pull-down transistors 64 affect the line 67 while pull-up transistor 66b keeps the voltage on line 67 to Vcc. This, in turn, keeps p-channel output pull-up transistor 70 off. Therefore, the output signal OUT, which is connected to the output of both output transistors 70 and 80, remains at the middle voltage level induced by the load 14, which, as described hereinabove, is 2.0 V.

Figure 8A:
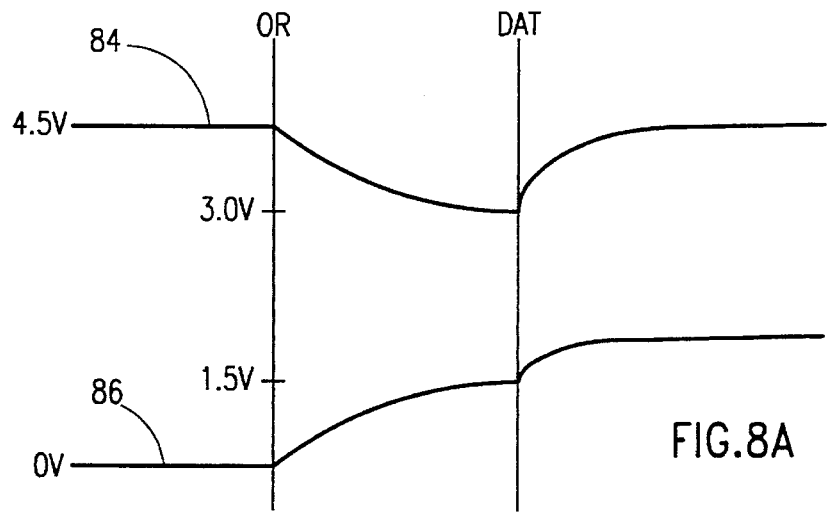
FIG. 8A is a graphical illustration of the operation of the output buffer of FIG. 7 in response to certain control signals.
Figure 8B:
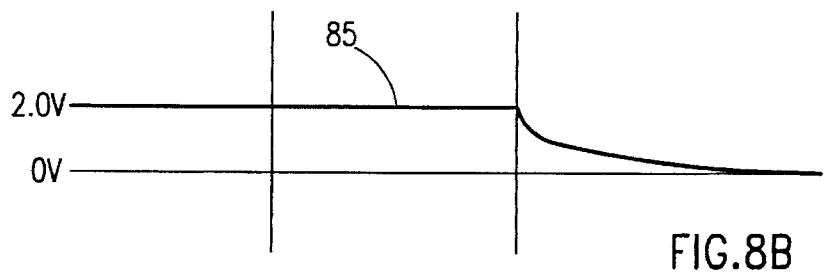
FIG. 8B is a graphical illustration of the output signal in response to the same control signals of FIG. 8A.

Reference is now also made to FIGS. 8A and 8B. The states of lines 67 and 77 are illustrated in graphs 84 and 86 respectively, of FIG. 8A. The states of output line 82 are illustrated in graph 85 of FIG. 8B. Before the OR signal is activated, line 67 is at the Vcc voltage level of 4.5 V and line 77 is at the Vss voltage level of 0 V. The output signal (graph 85) is at 2.0 V.

When the OR signal becomes active, p-channel pull-up transistor 74b becomes on and n-channel pull-down transistor 76b becomes off. Transistors 74c and 76c are partially on, since the DAT signal, which is switched in accordance with the INR signal, is still at Vcc/2. N-channel transistor 74d, the only n-channel pull-up transistor 74, is also on since the Vccr supply is always high. Therefore, the pull-up transistors 74 start pulling up the voltage on line 77. Transistor 76c, which receives the DAT signal and is therefore partially on, opposes the pull-up of transistors 74. Capacitor 78 ensures that the pull-up is not performed too quickly. As the voltage on line 77 increases, the n-channel output pull-down transistor 80 begins to be activated.

In accordance with the present invention, the gate of the n-channel output pull-down transistor 80, connected to line 77, is brought to a predetermined voltage somewhat higher than its threshold voltage of 0.8 V, for example, to a voltage of 1.5 V. However, even if the data on the DAT signal arrives late, the gate voltage should not exceed the predetermined voltage level. Therefore, transistor 76c, which opposes the pull-up, should leak enough current, even when partially on, to limit the pull-up. The ratio of the sizes of transistors 74d and 76c determines the limiting voltage.

On branch 60, the opposite occurs and the voltage on line 67 begins to reduce. Once again, the ratio of the sizes of two transistors, in this case, of transistors 64d and 66c, is important so as to ensure that the voltage on line 67 will not move too low before the data causes the correct transition to the desired output voltage level. The voltage level on line 67 reduces the gate of the p-channel output pull-up transistor 70 to a predetermined voltage somewhat lower than its threshold voltage of 4.5 V, for example, to a voltage of 3.0 V.

As the voltages on lines 67 and 77 move past the threshold voltages of the gates of output transistors 70 and 80, both output transistors 70 and 80 provide some current, but in opposite directions. As a result, neither affects the output line 82 and it remains at the middle voltage level induced by the load 14.

The movements of the voltages on lines 67 and 77, due to operation of branches 60 and 62, are shown in the graphs 84 and 86 of FIG. 8A. As can be seen, the voltages begin to move fairly quickly to the predetermined levels once the OR signal arrives. For example, the voltage on line 67 moves to 3.0 V and the voltage on line 77 moves to 1.5 V.

When the data on the DAT signal appears (which occurs shortly after the INR signal switches), the branches 60 and 62 cease operating in opposite directions. FIGS. 8A and 8B illustrate the activity for the case of reading a "0" (i.e. when DAT goes toward Vss).

When DAT goes to "0", on branch 62, n-channel transistor 76c (FIG. 7) is deactivated and p-channel transistor 74c is fully activated. Since all of the pull-down transistors 76 are now deactivated and all of the pull-up transistors 74 are activated, the speed at which transistors 74 pull-up the voltage level of line 77 (see FIG. 8A, curve 86) is limited by n-channel transistor 74d. Since n-channel transistor 74d is controlled by Vccr which is typically which has a voltage level of less than or equal to the Vcc voltage level, the n-channel transistor 74d does not have a strong drive and it can only bring the line 77 to a maximum voltage level of Vccr−$V_T$, where $V_T$ is the threshold voltage of the transistor 74d. The rise in voltage level of line 77 more fully activates output pull-down transistor 70 which pulls output line 82 down, as shown in curve 85 of FIG. 8B.

When the n-channel transistor 74d first operates, its gate to source voltage Vgs is large, since Vccr, at 4.6 V, is much higher than the 1.5 V at which the voltage stood before the data on the DAT signal arrived. As a result, the voltage of line 77 rises quickly. However, as the voltage of line 77 rises, the gate to source voltage Vgs reduces and accordingly, so does the rate of voltage rise.

More specifically, since the current on pull-down transistor 80 is:

$$I_{80}=C(Vgs-V_T)^2,$$

where Vgs is the voltage on the line 77, the current on pull-down transistor 80 is low at the beginning and therefore, its gate can be moved quickly. However, as Vgs changes, the rate of current change, $dI_{80}/dt$, is $2C(Vgs-V_T)$ which is proportional to Vgs. Hence, the rate of change of voltage is slowed down. This emulates the desired gate voltage ramping shown in curve 4 of FIG. 1.

On branch 60, transistor 64c is deactivated and transistor 66c is activated. Since pull-downs 64 are no longer active, transistor 66c pulls the voltage on line 67 up towards Vcc which deactivates output pull-down transistor 70.

Thus, output pull-down transistor 80 pulls the output line 82 to go to the Vss voltage level, as can be seen in graph 85 (FIG. 8B).

The opposite occurs when DAT indicates a "1" (e.g. the DAT signal goes to Vcc). On branch 60, transistor 64c is activated and transistor 66c is deactivated. The voltage on line 67 is pulled down which activates output pull-up transistor 70. The output pull-up transistor 70 pulls the output voltage to Vcc which generally does not affect the input as much as the transition to the "0" value.

On branch 62, transistor 74c is deactivated and transistor 76c is activated. The voltage on line 77 is pulled down towards Vss and, as a result, output pull-down transistor 80 is deactivated. Thus, output pull-up transistor 70 pulls the output line 82 to Vcc.

It will be appreciated that the OR signal prepares, or "precharges", the gates of output transistors 70 and 80 for their upcoming action which will be initiated by the DAT signal. In response to the OR signal, the gates of the output transistors 70 and 80 are at or close to their threshold levels. Thus, once the DAT signal arrives, the output transistors 70 and 80 can begin affecting the output signal OUT immediately.

It is noted that, ideally, the output buffer should have temperature compensation. To help with the temperature compensation, the gate rise time is controlled by capacitor 78 since capacitance is temperature independent. Nonetheless, for the example presented herein, the noise level is highest at −55° C. and a Vcc voltage level of 5.5 V.

Figure 9A:
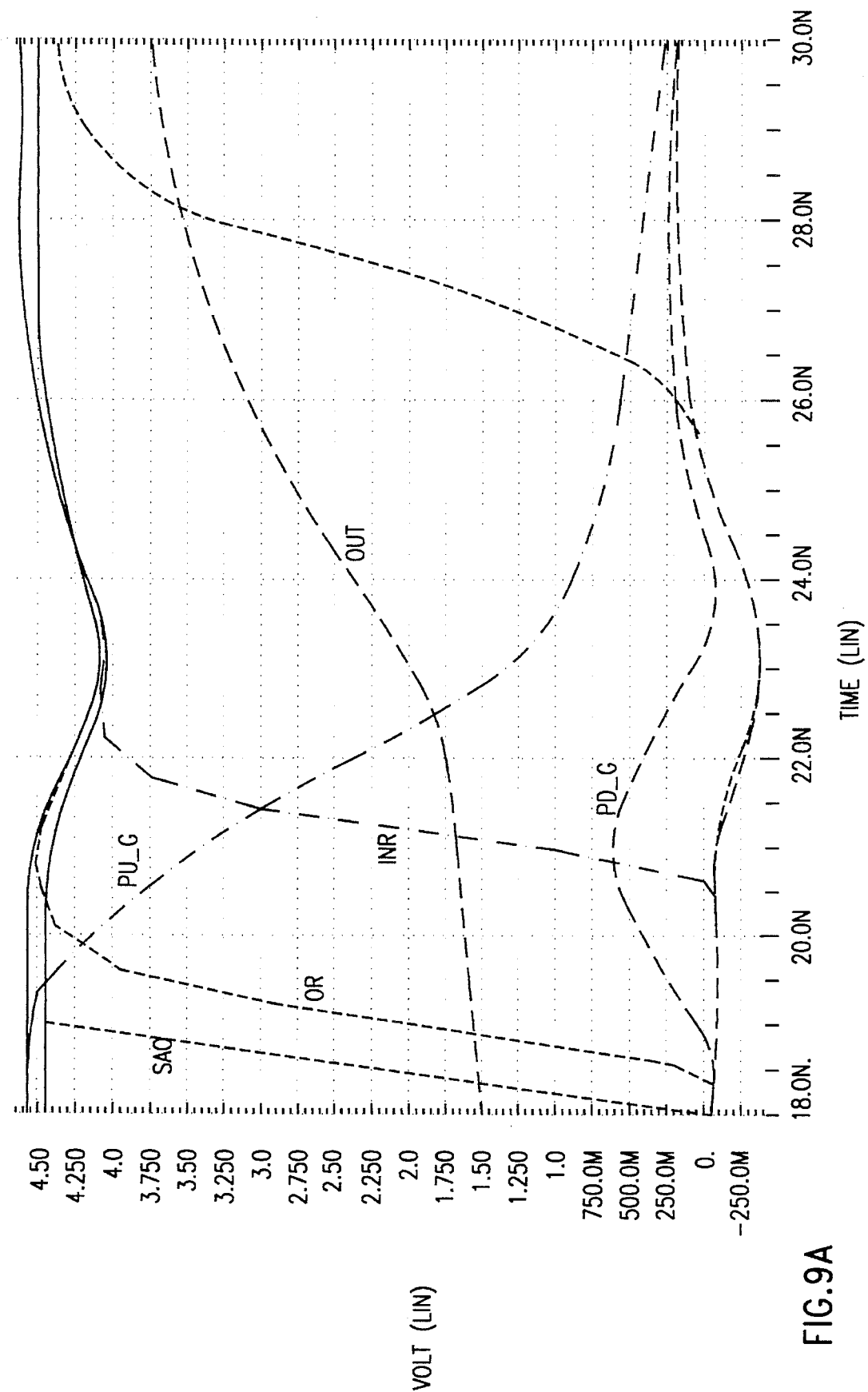
FIGS. 9A and 9B are graphical illustrations of the voltage of certain signals when putting out a "1" and a "0", respectively.
Figure 9B:
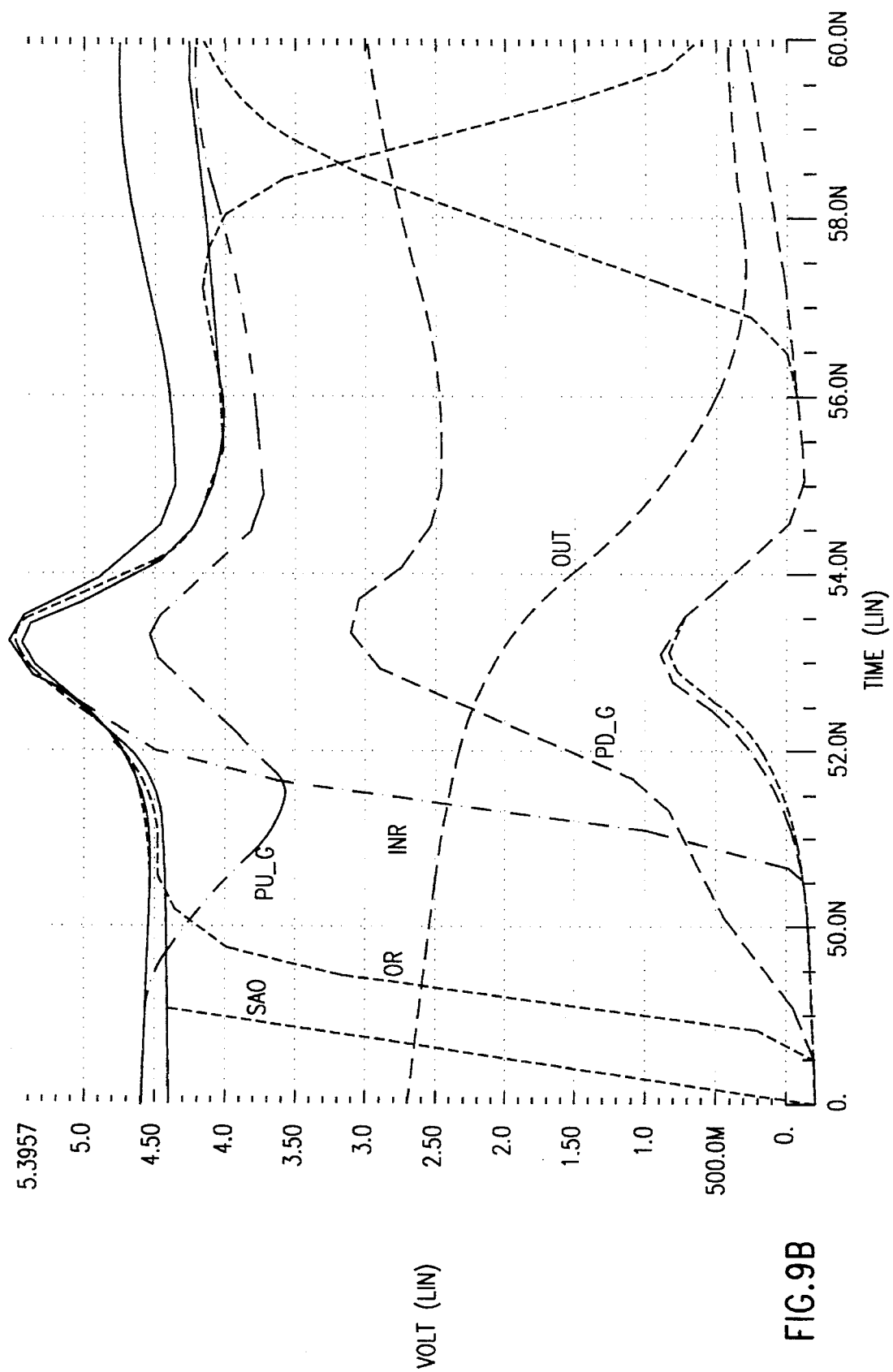

Reference is now briefly made to FIGS. 9A and 9B which illustrate the movement of the various signals when reading a "1" after having read a "0" (FIG. 9A) and a "0" (FIG. 9B), for a load of 100 pF. Since it takes time to transition from a "1" to a "0" and vice versa, the OUT signal, labeled OUT, is not at its middle state of 2.0 V at the beginning of either Figure. In FIG. 9A it begins at 1.5 V and in FIG. 9B it begins at 2.7 V.

In both Figures, the OR signal, labeled OR, comes before the INR signal arrives and causes the gates of the pull-up and pull-down transistors 70 and 80 to begin moving. This is shown by the signals labeled PU_G and PD_G respectively. The signal PU_G moves down while the signal PD_G moves up.

When the INR signal comes, the SAO signal is released and the DAT signal (not shown) is produced. In FIG. 9A (reading a "1"), signals PU_G and PD_G both decrease, causing pull-up transistor 70 to be activated and to pull up the output signal OUT.

When a "0" is read, signals PU_G and PD_G both increase, causing pull-down transistor 80 to be activated and to pull down the output signal OUT.

As can be seen in FIGS. 9A and 9B, the output signal OUT remains near the middle state of 2.0 V until the INR signal arrives. However, prior to its arrival, the PU_G signal decreases and the PD_signal increases so that the output signal OUT can move towards its final value as soon as the INR signal arrives.

It will be appreciated by persons skilled in the art that the present invention is not limited to what has been particularly shown and described hereinabove. Rather the scope of the present invention is defined by the claims which follow:

I claim:

1. A method of producing an output signal from a memory array, the method comprising the steps of:

producing an output release signal and an input release signal wherein said output release signal becomes active prior to said input release signal;

utilizing said input release signal to produce a data signal from a sense amplifier output only once said input release signal becomes active, wherein said data signal has a voltage level;

utilizing said output release signal to bring gate voltages of an n-channel pull-down transistor and a p-channel pull-up transistor, forming part of an output buffer, to slightly above and slightly below, respectively, their corresponding threshold levels; and utilizing said data signal to fully activate one of said transistors and to deactivate the other of said transistors in accordance with said data signal.

2. The method according to claim 1 wherein said input release signal is a delayed version of said output release signal.

3. The method according to claim 1 wherein said step of utilizing said data signal includes the step of producing said output signal from said memory array by cresting said output signal up or down to a desired output value in response to said voltage level of said data signal and asymptotically approaching said desired output value.

4. An output device comprising:

an output control unit having an input terminal, an output terminal, and a control terminal, said control terminal coupled to an output release line carrying an output release signal, said input terminal coupled to a sense amplifier output line carrying a data signal from a memory cell, said output terminal coupled to a data line carrying an amplified version of said data signal released in response to an input release signal, generated by said output control unit, wherein said input release signal is a delayed version of said output release signal; and an output buffer controlled by said output release signal, and said amplified version of said data signal, said output buffer outputting an output signal corresponding to said amplified version of said data signal, said output buffer including a plurality of output transistors, said output release signal controls said output buffer to maintain corresponding gate voltages of said plurality of output transistors near corresponding threshold voltages of said plurality of output transistors until said amplified version of said data signal is applied to said output buffer.

5. An output device comprising:

an output control unit having an input terminal, an output terminal, and a control terminal, said control terminal coupled to an output release line carrying an output release signal, said input terminal coupled to a sense amplifier output line carrying a data signal from a memory cell, said output terminal coupled to a data line carrying an amplified version of said data signal released in response to an input release signal, generated by said output control unit, wherein said input release signal is a delayed version of said output release signal; and an output buffer controlled by said output release signal, and said amplified version of said data signal, said output buffer outputting an output signal corresponding to said amplified version of said data signal;

said output buffer including an n-channel pull-down transistor having a first gate, a first threshold voltage, a first terminal, and a second terminal, said second terminal connected to a ground, said first terminal connected to an output line to output said output signal of said output buffer;

said output buffer including a first control unit connected to at least said output release line, said data line and a first gate control line connected to said first gate of said n-channel pull-down transistor;

said output buffer including a p-channel pull-up transistor having a second gate, a second threshold voltage, a third terminal and a fourth terminal, said third terminal connected to a power supply, said fourth terminal connected to said output line;

said output buffer including a second control unit connected to at least said output release line, said data line and a second gate control line connected to said second gate of said p-channel pull-up transistor;

wherein said first control unit applies a first voltage to said first gate control line and said second control unit applies a second voltage to said second gate control line in response to said output release signal becoming active, wherein said first voltage is slightly above said first threshold level of said first gate, and said second voltage is slightly below said second threshold level of said second gate; and wherein said first and second control units fully activate one of said transistors and deactivate the other of said transistors in accordance with said data signal.

6. The output device according to claim 5 wherein said first control unit is connected to a regulated Vccr power supply, said first control unit includes one regulated Vccr power supply pull-up transistor connected to said regulated Vccr power supply and one data pull-down transistor connected to said data line, wherein a size of said data pull-down transistor is a function of a size of said regulated Vccr power supply pull-up transistor.

7. An output device comprising:

an output control unit having an input terminal, an output terminal, and a control terminal, said control terminal coupled to an output release line carrying an output release signal, said input terminal coupled to a sense amplifier output line carrying a data signal from a memory cell, said output terminal coupled to a data line carrying an amplified version of said data signal released in response to an input release signal, generated by said output control unit, wherein said input release signal is a delayed version of said output release signal; and an output buffer controlled by said output release signal, and said amplified version of said data signal, said output buffer outputting an output signal corresponding to said amplified version of said data signal, said output buffer including a plurality of output transistors, said output release signal controls said output buffer to maintain corresponding gate voltages of said plurality of output transistors near corresponding threshold voltages of said plurality of output transistors until said amplified version of said data signal is applied to said output buffer;

said output control unit including a delay unit connected to receive said output release signal and to output said input release signal; and said output control unit including a trip inverter controlled by said input release signal and connected on input to said sense amplifier output line and on output to said data line for releasing said amplified version of said data signal in response to said input release signal.

* * * * *